United States Patent
Imai (10) Patent No.: US 10,488,764 B2
(45) Date of Patent: Nov. 26, 2019

(54) LITHOGRAPHY APPARATUS, LITHOGRAPHY METHOD, AND METHOD OF MANUFACTURING ARTICLE

(71) Applicant: CANON KABUSHIKI KAISHA, Tokyo (JP)

(72) Inventor: Masaki Imai, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 149 days.

(21) Appl. No.: 14/571,709

(22) Filed: Dec. 16, 2014

(65) Prior Publication Data

US 2015/0192867 A1    Jul. 9, 2015

(30) Foreign Application Priority Data

Jan. 7, 2014    (JP) ................. 2014-001238

(51) Int. Cl.
*G03B 27/52*    (2006.01)
*G03F 7/20*    (2006.01)
*G03F 9/00*    (2006.01)

(52) U.S. Cl.
CPC ........ *G03F 7/70641* (2013.01); *G03F 9/7026* (2013.01)

(58) Field of Classification Search
CPC ...... G03F 9/7026; G03F 9/7023; G03F 9/703; G03F 9/7034; G03F 7/70258; G03F 7/70266; G03F 7/70358; G03F 7/70616; G03F 7/70641; G03F 7/70666; G03F 7/70675
USPC ......... 355/52, 53, 55, 67–74, 77; 250/492.1, 250/492.2, 492.22, 493.1, 548
See application file for complete search history.

(56) References Cited

U.S. PATENT DOCUMENTS

| | | | | |
|---|---|---|---|---|
| 5,365,051 A | * | 11/1994 | Suzuki | G03F 9/7026 250/201.2 |
| 5,742,067 A | * | 4/1998 | Imai | G03F 7/70358 250/548 |
| 6,163,369 A | * | 12/2000 | Yamada | G03F 9/7046 355/53 |

(Continued)

FOREIGN PATENT DOCUMENTS

| | | |
|---|---|---|
| JP | H06036991 A | 2/1994 |
| JP | H08227854 A | 9/1996 |

(Continued)

OTHER PUBLICATIONS

Office Action issued in Japanese Appln. No. 2014-001238 dated Sep. 22, 2017. English translation provided.

*Primary Examiner* — Christina A Riddle
(74) *Attorney, Agent, or Firm* — Rossi, Kimms & McDowell LLP (57) ABSTRACT

The present invention provides a lithography apparatus which forms a pattern on a substrate with a beam, the apparatus comprising a stage configured to hold the substrate and be movable, and a controller configured to control focus driving of the stage based on a measurement value obtained for the focus driving with respect to a measurement point on the substrate and a correction value for the measurement value, wherein the controller is configured to generate the correction value so as to reduce a focus error in a case where the stage is driven based on the measurement value.

10 Claims, 8 Drawing Sheets

(56) References Cited

U.S. PATENT DOCUMENTS

| | | | | |
|---|---|---|---|---|
| 6,236,447 B1 * | 5/2001 | Yamada | ............... | G03F 9/7034 355/53 |
| 7,206,058 B2 * | 4/2007 | Modderman | ............ | G03F 9/70 355/53 |
| 2007/0019176 A1 * | 1/2007 | Akamatsu | .............. | G03B 27/52 355/55 |
| 2007/0229791 A1 * | 10/2007 | Inoue | ................ | G01B 11/0608 355/67 |

FOREIGN PATENT DOCUMENTS

| JP | 2001015422 A | 1/2001 |
|---|---|---|
| JP | 2008071839 A | 3/2008 |

\* cited by examiner

LITHOGRAPHY APPARATUS, LITHOGRAPHY METHOD, AND METHOD OF MANUFACTURING ARTICLE

BACKGROUND OF THE INVENTION

Field of the Invention

The present invention relates to a lithography apparatus, a lithography method, and a method of manufacturing an article.

Description of the Related Art

An exposure apparatus which transfers a mask pattern onto a substrate is one of apparatuses to be used in a manufacturing step (lithography step) of a semiconductor device or the like. In this exposure apparatus, it is necessary to accurately arrange the substrate surface on the image formation surface (focusing surface) of a projection optical system in order to accurately overlay the mask pattern on a shot region on the substrate. Japanese Patent Laid-Open No. 2001-15422 has proposed a method of correcting a positional shift of the surface of a substrate in a direction (Z direction) parallel to the optical axis of a projection optical system, which is produced by driving of a substrate stage in a direction (XY direction) perpendicular to the optical axis, in a scanning exposure apparatus which exposes the substrate while scanning it. This positional shift can occur due to, for example, the shape of the surface of a stage base on which the substrate stage moves.

In this scanning exposure apparatus, control is so performed that the substrate surface is arranged on an image plane in parallel with substrate scanning. However, if the control system has a manufacturing error of a mechanism (for example, the stage base), a measurement error of a measuring device (for example, a laser interferometer), or a control error (for example, a stationary error) of a controller, it becomes difficult to arrange the substrate surface on the image plane.

SUMMARY OF THE INVENTION

The present invention provides, for example, a lithography apparatus advantageous in terms of focus performance.

According to one aspect of the present invention, there is provided a lithography apparatus which forms a pattern on a substrate with a beam, the apparatus comprising: a stage configured to hold the substrate and be movable; and a controller configured to control focus driving of the stage based on a measurement value obtained for the focus driving with respect to a measurement point on the substrate and a correction value for the measurement value, wherein the controller is configured to generate the correction value so as to reduce a focus error in a case where the stage is driven based on the measurement value.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given. Also, a lithography apparatus according to the present invention can include a lithography apparatus which forms a pattern on a substrate with a beam. This lithography apparatus can include an exposure apparatus (a step-and-repeat or step-and-scan type exposure apparatus), and a drawing apparatus using a charged-particle beam. In the following embodiment, an example using a step-and-scan type exposure apparatus (scanner) as the lithography apparatus will be explained.

First Embodiment

Figure 1:
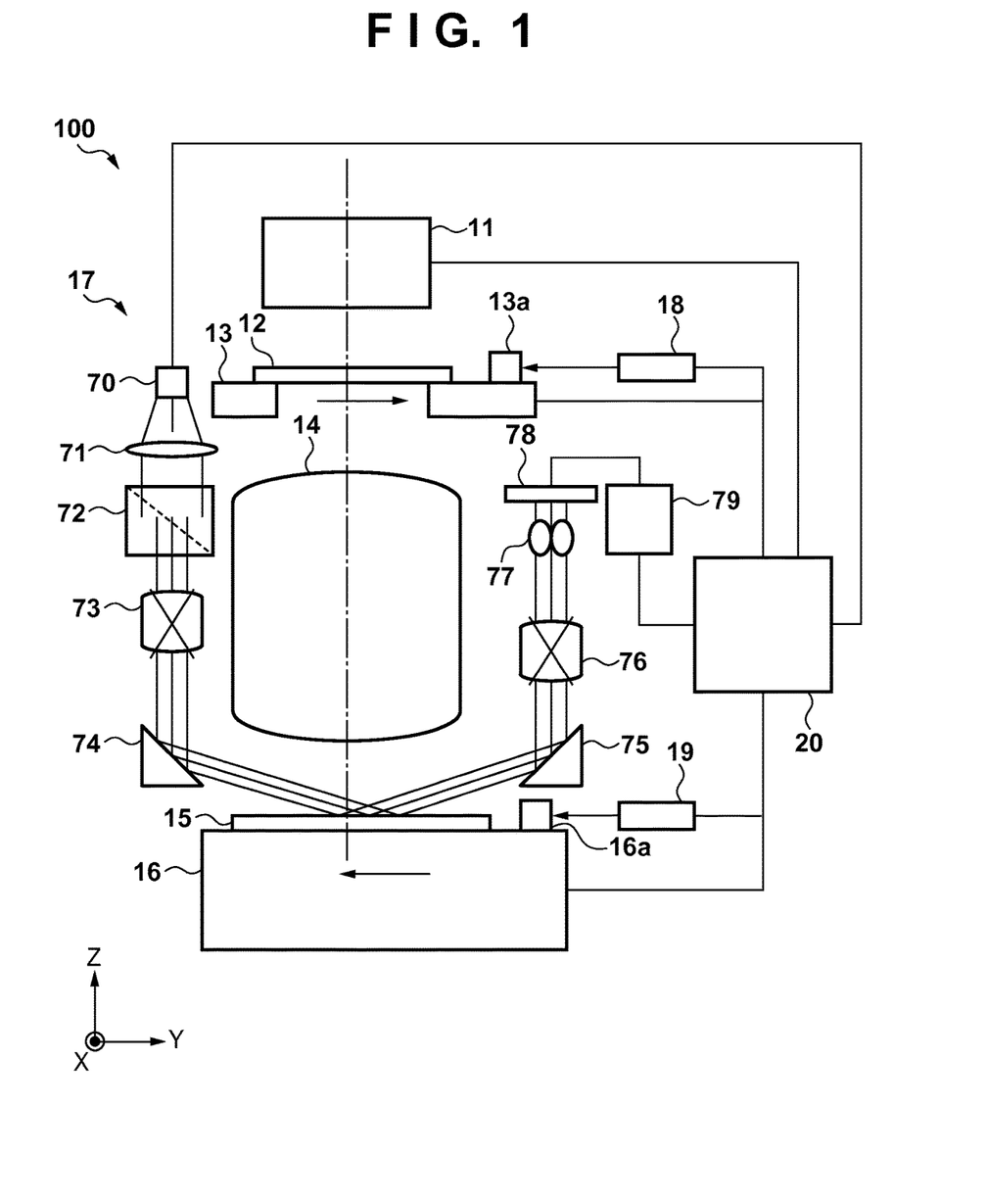
FIG. 1 is a schematic view showing the arrangement of an exposure apparatus of the first embodiment.

An exposure apparatus 100 of the first embodiment of the present invention will be explained with reference to FIG. 1. FIG. 1 is a schematic view showing the arrangement of the exposure apparatus 100 of the first embodiment of the present invention. The exposure apparatus 100 of the first embodiment is a step-and-scan type scanning exposure apparatus which performs scanning exposure on a substrate 15 by using slit-shaped light. The exposure apparatus 100 includes an illumination optical system 11, mask stage 13, projection optical system 14, substrate stage 16 (stage), measuring device 17, first detector 18, second detector 19, and controller 20. The controller 20 includes a CPU and memory, and controls the whole (the individual units) of the exposure apparatus 100. That is, the controller 20 controls a process of transferring a pattern formed on a mask 12 onto the substrate 15 (a process of performing scanning exposure on the substrate 15.

The illumination optical system 11 shapes light emitted from a light source (not shown) such as an excimer laser into band-like or arcuate slit-shaped light elongated in, for example, the Y direction by using a light-shielding member such as a masking blade included in the system, and illuminates a portion of the mask 12 with this slit-shaped light. The mask 12 and substrate 15 are respectively held by the mask stage 13 and substrate stage 16, and are arranged in optically almost conjugate positions (the object plane and image plane of the projection optical system 14) via the projection optical system 14. The projection optical system 14 has a predetermined projection magnification (for example, ×½ or ×¼), and projects the pattern formed on the mask 12 onto the substrate by using the slit-shaped light. A region of the substrate 15 on which the pattern of the mask 12 is projected (a region to be irradiated with the slit-shaped light) will be referred to as an irradiation region 21 hereinafter. The mask stage 13 and substrate stage 16 are so configured as to be movable in a direction (for example, the Y direction) perpendicular to the optical axis of the projection optical system 14 (the optical axis of the slit-shaped light), and are relatively scanned in synchronism with each other at a velocity ratio matching the projection magnification of the projection optical system 14. This makes it possible to scan the irradiation region 21 on the substrate, and transfer the pattern of the mask 12 onto a shot region 15a on the substrate. This scanning exposure is sequentially repeated on each of a plurality of shot regions 15a on the substrate while moving the substrate stage 16 step by step, thereby completing an exposure process for one substrate 15.

The first detector 18 includes, for example, a laser interferometer, and detects the position of the mask stage 13. For example, the laser interferometer included in the first detector 18 emits a laser beam toward a reflecting plate 13a formed on the mask stage 13, and detects a displacement from a reference position on the mask stage 13 by the laser beam reflected by the reflecting plate 13a. Accordingly, the first detector 18 can acquire the present position of the mask stage 13 based on the displacement. Also, the second detector 19 includes, for example, a laser interferometer, and detects the position of the substrate stage 16. For example, the laser interferometer included in the second detector 19 emits a laser beam toward a reflecting plate 16a formed on the substrate stage 16, and detects a displacement from a reference position on the substrate stage 16 by the laser beam reflected by the reflecting plate 16a. Thus, the second detector 19 can acquire the present position of the substrate stage 16 based on the displacement. Then, based on the present positions of the mask stage 13 and substrate stage 16 respectively acquired by the first detector 18 and second detector 19, the controller 20 controls driving of the mask stage 13 and substrate stage 16 in the XY direction. The first and second detectors 18 and 19 use laser interferometers when detecting the positions of the mask stage 13 and substrate stage 16, respectively. However, the present invention is not limited to this, and it is also possible to use, for example, encoders.

The measuring device 17 measures the height of the substrate surface in a state in which the substrate stage 16 is moving, in order to align the surface of the substrate 15 (to be referred to as a substrate surface hereinafter) with the image formation plane (focus plane) of the projection optical system 14. The measuring device 17 of the first embodiment is an oblique incidence type measuring device which obliquely irradiates the substrate 15 with light, and includes an irradiation system 17a for irradiating the substrate 15 with light, and a light-receiving system 17b for receiving light reflected by the substrate 15.

Figure 2:
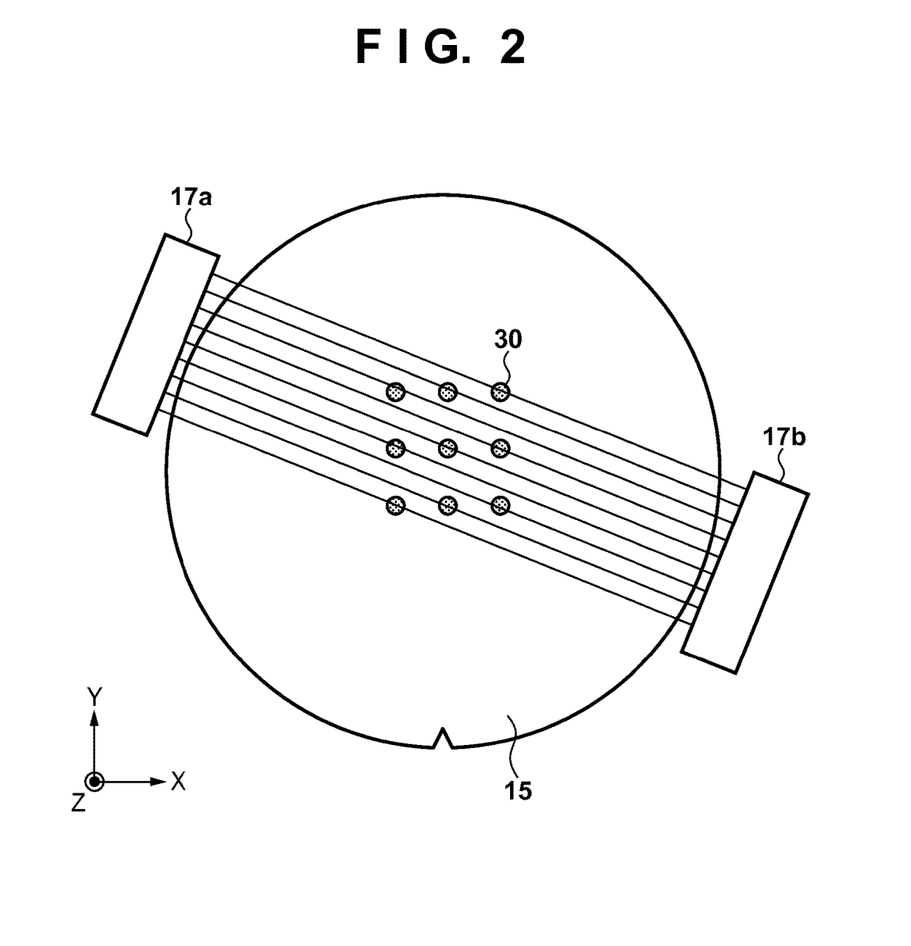
FIG. 2 is a view showing the layout of a plurality of measurement positions in a measuring device.

The irradiation system 17a can include, for example, a light source 70, collimator lens 71, slit member 72, optical system 73, and mirror 74. The light source 70 is formed by using, for example, a lamp or light-emitting diode, and emits light having a wavelength to which a resist on the substrate is not sensitive. The collimator lens 71 collimates the light emitted from the light source 70 into parallel light having an almost uniform light intensity distribution in the section. The slit member 72 is formed by a pair of prisms bonded to each other such that their oblique surfaces oppose each other. A light-shielding film such as a chromium film having a plurality of openings (for example, nine pinholes) is formed on a bonding surface 72a. The optical system 73 is a both side telecentric optical system, and allows nine light beams passing through the plurality of openings in the slit member 72 to enter the substrate via the mirror 74. The optical system 73 is so configured that the surface 72a having the openings and a surface including the substrate surface satisfy the Scheimpflug's condition. In this embodiment, the mirror 74 is formed such that an angle $\phi$ at which each light beam emitted from the irradiation system 17a enters the substrate 15 (that is, an angle between the light beam and the optical axis of the projection optical system 14) is, for example, 70° or more. Also, as shown in FIG. 2, the irradiation system 17a is so configured as to allow the nine light beams to enter the substrate 15 at an angle $\theta$ (for example, 22.5°) with respect to the scanning direction (Y direction) of the slit-shaped light, in the direction (XY direction) parallel to the substrate surface. By thus causing the nine light beams to enter the substrate 15, it is possible to individually perform measurement (focus measurement) of the height of the substrate surface in nine measurement positions (a plurality of measurement portions).

The light-receiving system 17b includes, for example, a mirror 75, light-receiving optical system 76, correction optical system 77, photoelectric converter 78, and processor 79. The mirror 75 guides the nine light beams reflected by the substrate 15 to the light-receiving optical system 76. The light-receiving optical system 76 is a both side telecentric optical system, and includes a stop formed in common to the nine light beams. This stop included in the light-receiving optical system 76 blocks high-order diffracted light (noise light) generated due to the circuit pattern formed on the substrate. The correction optical system 77 includes a plurality of (nine) lenses corresponding to the nine light beams, and forms images of the nine light beams on the light-receiving surface of the photoelectric converter 78, thereby forming pinhole images on the light-receiving surface. The photoelectric converter 78 includes a plurality of (nine) photoelectric conversion elements corresponding to the nine light beams. As each photoelectric conversion elements, it is possible to use, for example, a CCD line sensor. The processor 79 calculates the height of the substrate surface at each measurement position 30 based on the position of each pinhole image on the light-receiving surface of the photoelectric converter 78.

By thus configuring the irradiation system 17a and light-receiving system 17b, the measuring device 17 can perform measurement (focus measurement) of the height of the substrate surface in each measurement position 30 (each measurement portion) based on the position of each pinhole image on the light-receiving surface of the photoelectric converter 78. Then, the controller 20 controls focus driving of the substrate stage 16 based on the measurement values obtained by the measuring device 17, so that the substrate surface is arranged at the target height (focusing plane). The light-receiving system 17b performs tilt correction such that each measurement position 30 on the substrate and the light-receiving surface of the photoelectric converter 78 become conjugate with each other. Accordingly, the position of each pinhole image on the light-receiving surface of the photoelectric converter 78 does not change due to a local inclination at each measurement position 30.

Figure 3A:
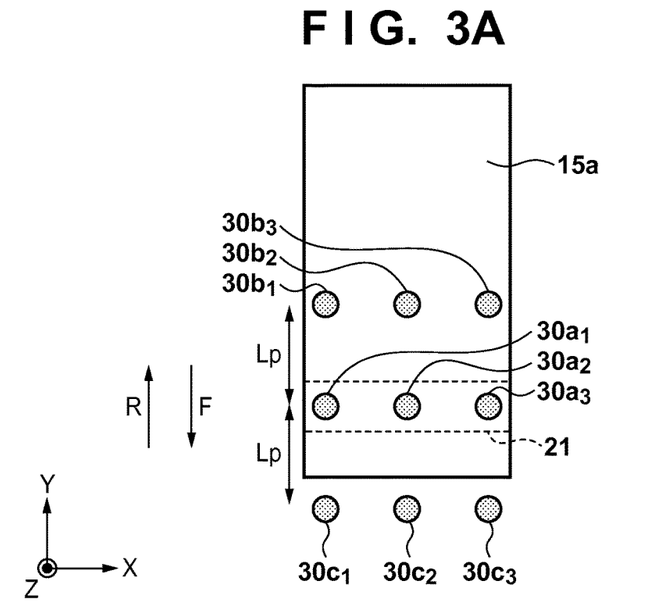
FIG. 3A is a view showing an example of the positional relationship between the plurality of measurement positions in the measuring device and irradiation region to be irradiated with slit-shaped light.
Figure 3B:
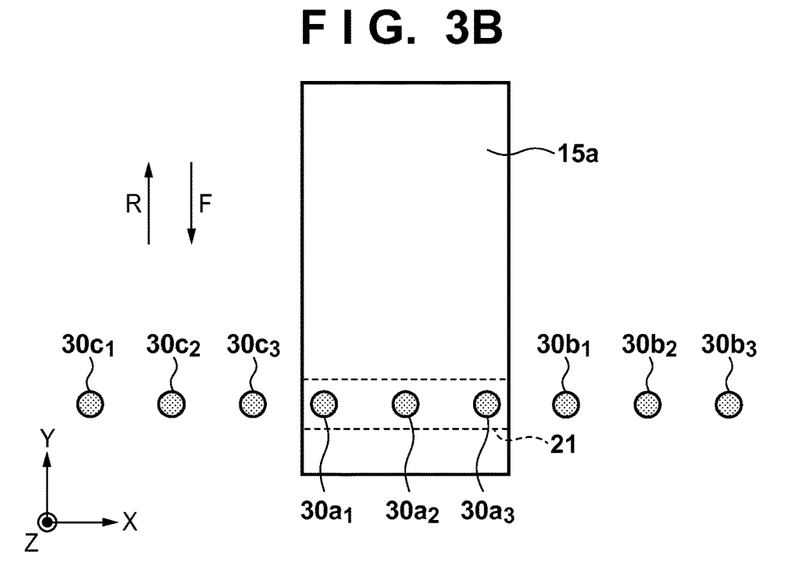
FIG. 3B is a view showing an example of the positional relationship between the plurality of measurement positions in the measuring device and the irradiation region to be irradiated with slit-shaped light.

FIGS. 3A and 3B are views each showing the positional relationship between the plurality of measurement positions 30 in the measuring device 17 and the irradiation region 21 to be irradiated with the slit-shaped light. FIG. 3A is a view showing the positional relationship between the nine measurement positions 30 to be formed in the shot region $15a$ on the substrate by the measuring device 17 and the irradiation region 21. Referring to FIG. 3A, the irradiation region 21 is a rectangular region enclosed within broken lines. Measurement positions $30a_1$ to $30a_3$ are measurement positions 30 (second measurement positions (second measurement portions)) formed inside the irradiation region 21, and focus measurement is performed on these measurement points in parallel with exposure of measurement points on the substrate. Also, measurement positions $30b_1$ to $30b_3$ and $30c_1$ to $30c_3$ are measurement positions 30 (first measurement positions (first measurement portions)) formed in positions spaced apart by a distance Lp in the scanning direction (±Y direction) of the slit-shaped light from the measurement positions $30a_1$ to $30a_3$ formed inside the irradiation region 21. The measurement positions $30b_1$ to $30b_3$ and $30c_1$ to $30c_3$ are used to perform focus measurement on the measurement points on the substrate before exposure of measurement points on the substrate, and are switched in accordance with the slit-shaped light scanning direction, that is, the moving direction of the substrate stage 16.

For example, when performing scanning exposure by moving the substrate stage 16 in the direction of an arrow F, the heights of a plurality of measurement points of the substrate surface are measured at the measurement positions $30b_1$ to $30b_3$ prior to measurement at the measurement positions $30a_1$ to $30a_3$ formed inside the irradiation region 21. Based on the measurement values at the measurement positions $30b_1$ to $30b_3$, the controller 20 determines a command value string for arranging the plurality of measurement points at a target height. Then, based on the determined command value string, the controller 20 controls Z-direction driving of the substrate stage 16 so that the plurality of measurement points are arranged at the target height until they reach the irradiation region 21. On the other hand, when performing scanning exposure by moving the substrate stage 16 in the direction of an arrow R, the heights of a plurality of measurement points of the substrate surface are measured at the measurement positions $30c_1$ to $30c_3$ prior to measurement at the measurement positions $30a_1$ to $30a_3$. Based on the measurement values at the measurement positions $30c_1$ to $30c_3$, the controller 20 determines a command value string for arranging the plurality of measurement points at a target height. Then, based on the determined command value string, the controller 20 controls Z-direction driving of the substrate stage 16 such that the plurality of measurement points are arranged at the target height until they reach the irradiation region 21.

Referring to FIG. 3A, the measurement positions $30b_1$ to $30b_3$ and $30c_1$ to $30c_3$ are so laid out as to measure the heights of a plurality of measurement points prior to measurements at the measurement positions $30a_1$ to $30a_3$ formed inside the irradiation region 21. However, the present invention is not limited to this. For example, as shown in FIG. 3B, the measurement positions $30b_1$ to $30b_3$ and $30c_1$ to $30c_3$ may also be laid out along the non-scanning direction (X direction) of the slit-shaped light. By thus laying out the plurality of measurement positions 30, during exposure of the shot region $15a$, the height of the substrate surface can be measured in a shot region to be exposed next (that is, an adjacent shot region in the non-scanning direction).

Figure 4A:
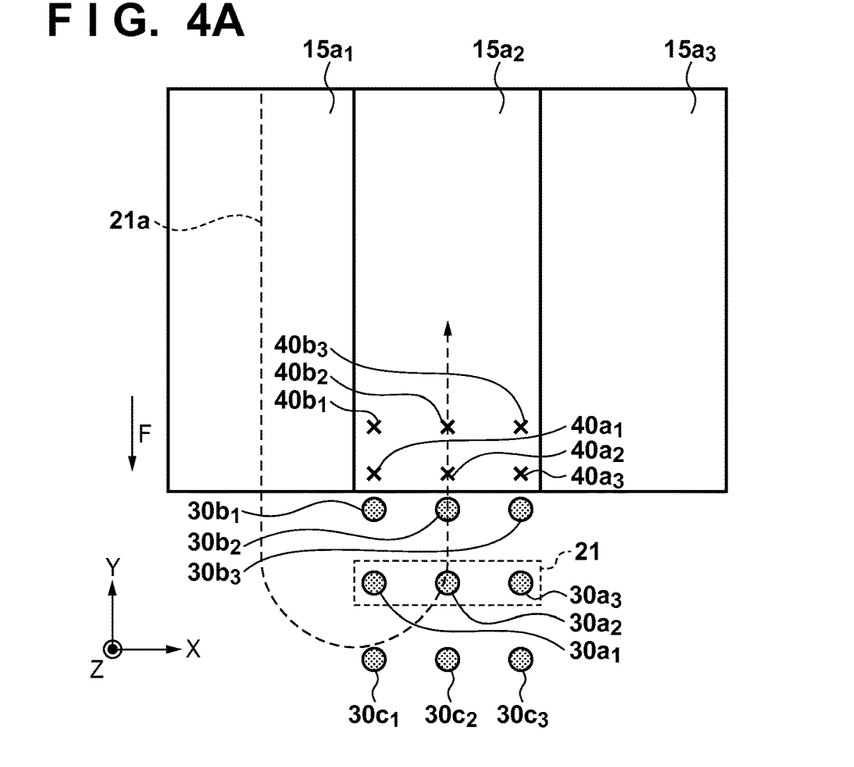
FIG. 4A is a view for explaining a method of measuring the height of the substrate surface by the measuring device while scanning exposure is performed.
Figure 4B:
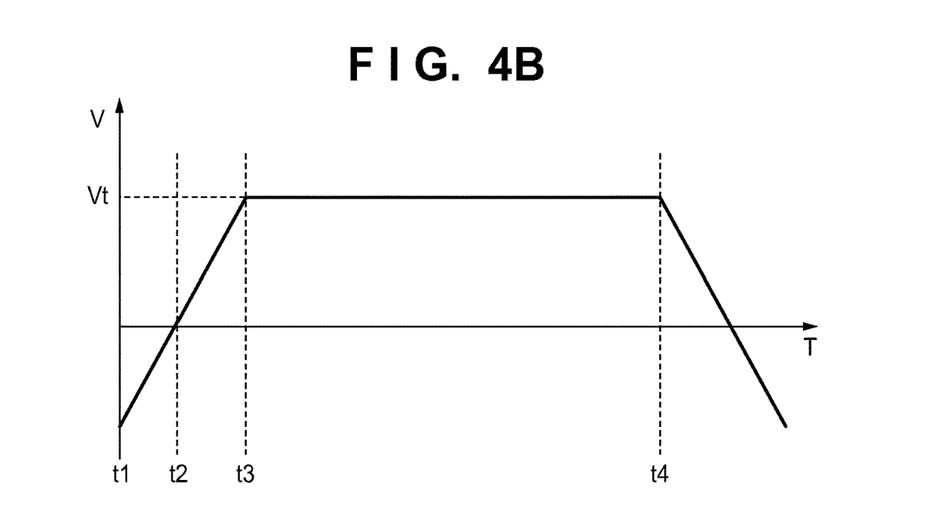
FIG. 4B is a view for explaining the method of measuring the height of the substrate surface by the measuring device while scanning exposure is performed.

Next, a method of measuring the height of the substrate surface by the measuring device 17 while performing scanning exposure will be explained with reference to FIGS. 4A and 4B. FIG. 4A is a view showing the positions of the plurality of measurement positions 30 in a case where scanning exposure is performed in the plurality of shot regions $15a$ formed on the substrate 15 and a scanning path $21a$ of the slit-shaped light (irradiation region 21). FIG. 4A shows an exposed shot region $15a_1$, a shot region $15a_2$ to be exposed next to the shot region $15a_1$, and a shot region $15a_3$ to be exposed next to the shot region $15a_2$. Exposure of the shot region $15a_2$ will be explained below. FIG. 4B is a view showing the relationship between the moving velocity of the substrate stage 16 in the Y direction and time when scanning the slit-shaped light along the scanning path $21a$ shown in FIG. 4A.

First, after exposure of the shot region $15a_1$ is complete, that is, after the irradiation region 21 comes out from shot region $15a_1$, the controller 20 decelerates the substrate stage 16 in the −Y direction, stops it, and accelerates it in the +Y direction (the direction of the arrow F). Referring to FIG. 4B, a period from time t1 to time t2 is equivalent to the period during which the substrate stage 16 is decelerated, and a period from time t2 to time t3 is equivalent to the period during which the substrate stage 16 is accelerated. Also, in a period from time t1 to time t3, the controller 20 drives the substrate stage 16 in the −X direction so that it is possible to start measurement at the measurement positions $30a_1$ to $30a_3$ in the shot region $15a_2$ and scanning exposure by the slit-shaped light. In this state, the Y-direction velocity of the substrate stage 16 needs to reach a target velocity before the irradiation region 21 approaches the shot region $15a_2$, and may reach the target velocity before the start of measurement at the measurement positions $30b_1$ to $30b_3$. That is, the Y-direction velocity of the substrate stage 16 may reach the target velocity before the measurement positions $30b_1$ to $30b_3$ approach the shot region $15a_2$.

Subsequently, the controller 20 exposes the shot region $15a_2$ while driving the substrate stage 16 at a uniform velocity. In FIG. 4B, this is equivalent to a period from time t3 to time t4. Based on the heights of measurement points 40 on the shot region $15a_2$ measured at the measurement positions $30b_1$ to $30b_3$, the controller 20 controls driving of the substrate stage 16 such that the substrate surface in the irradiation region 21 is arranged at the target height. For example, when the measurement positions $30b_1$ to $30b_3$ are arranged in measurement points $40a_1$ to $40a_3$ on the shot region $15a_2$, the controller 20 causes the measuring device 17 to measure the heights of the measurement points $40a_1$ to $40a_3$ at the measurement positions $30b_1$ to $30b_3$. Based on the measurement values at the measurement points $40a_1$ to $40a_3$, the controller 20 determines a command value for driving the substrate stage 16 so that the measurement points $40a_1$ to $40a_3$ are arranged at the target height. Then, the controller 20 drives the substrate stage 16 in accordance with the determined command value before the measurement points $40a_1$ to $40a_3$ are arranged in the irradiation region 21. Also, when the measurement positions $30b_1$ to $30b_3$ are arranged at the measurement points $40b_1$ to $40b_3$ on the shot region $15a_2$, the controller 20 causes the measuring device 17 to measure the heights of the measurement points $40b_1$ to $40b_3$ at the measurement positions $30b_1$ to $30b_3$. Based on the measurement values at the measurement points $40b_1$ to $40b_3$, the controller 20 determines a command value for driving the substrate stage 16 so that the measurement points $40b_1$ to $40b_3$ are arranged at the target height. Then, the controller 20 drives the substrate stage 16 in accordance with the determined command value before the measurement points $40b_1$ to $40b_3$ are arranged in the irradiation region 21.

In an exposure apparatus, when a substrate stage is driven in the Z direction in accordance with scanning of a substrate, feedback control is generally performed so as to arrange the substrate surface on a focusing plane. In this feedback control, however, if the response (response characteristic) of driving of the substrate stage to scanning of the substrate is insufficient, it may become difficult to arrange the substrate surface on the focusing plane. It may also become difficult to arrange the substrate surface on the focusing plane when a driving error occurs in the substrate stage. Accordingly, the exposure apparatus 100 of the first embodiment corrects the command value string by a correction value string, and controls Z-direction driving of the substrate stage 16 in accordance with the corrected command value string. The controller 20 generates in advance the correction value string before exposure so as to reduce a focus error between the height of the substrate surface and the target height, which occurs when the substrate stage 16 is driven in the Z direction in accordance with the command value string without correcting it by the correction value string. A method of generating a correction value string in the exposure apparatus 100 of the first embodiment will be explained below. The command value string herein mentioned is data obtained by enumerating command values at the plurality of measurement points 40 in (the shot region 15a of) the substrate 15. Also, the correction value string herein mentioned is data obtained by enumerating correction values at the plurality of measurement points 40 in (the shot region 15a of) the substrate 15.

Figure 5A:
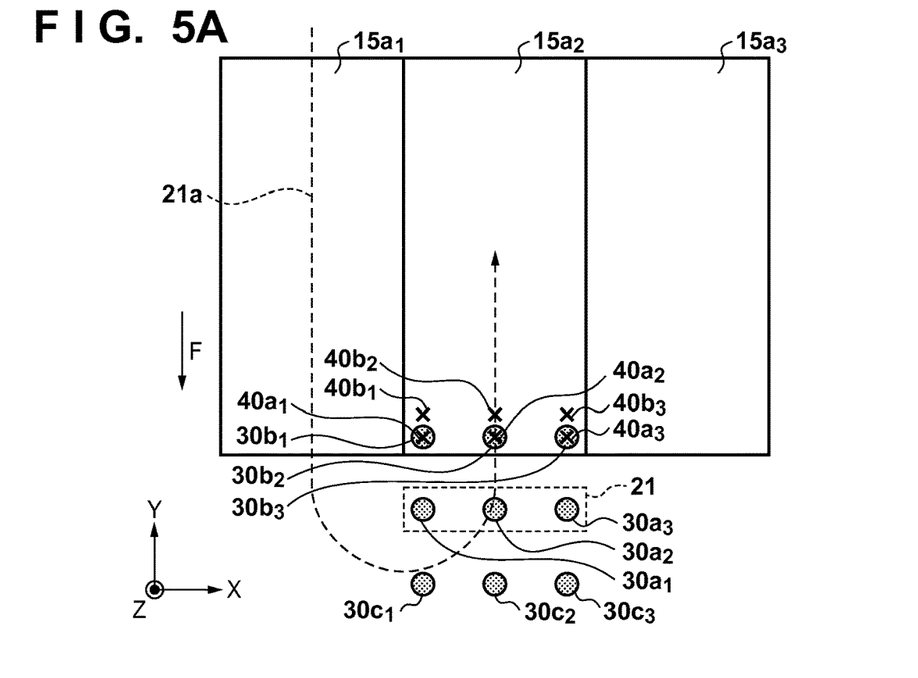
FIG. 5A is a view for explaining a method of generating a correction value string.
Figure 5B:
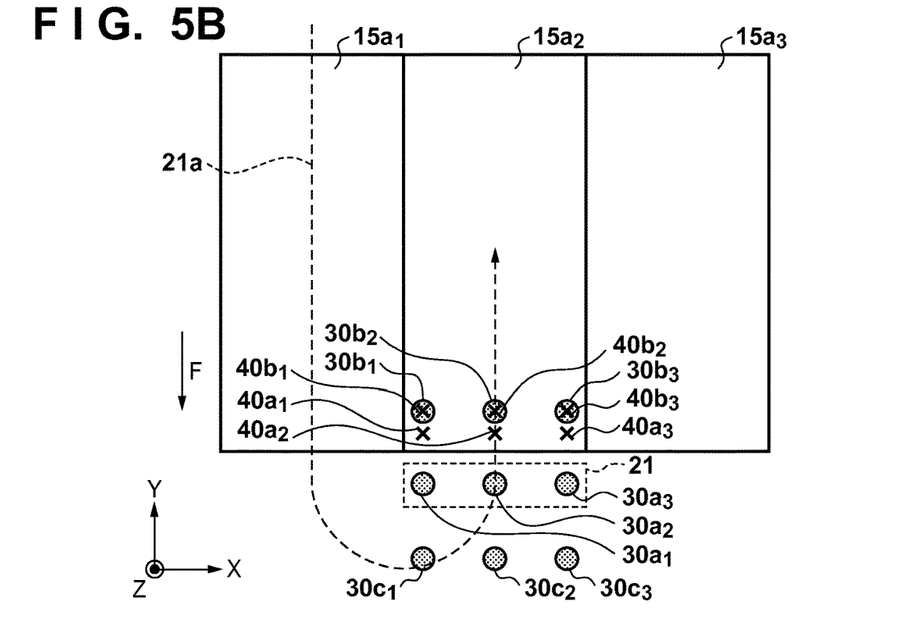
FIG. 5B is a view for explaining the method of generating a correction value string.

FIGS. 5A and 5B are views for explaining the method of generating a correction value string. A correction value string to be used when performing scanning exposure on a predetermined substrate can be acquired before the scanning exposure. For example, a correction value string to be used when performing scanning exposure on the nth substrate can be acquired by using substrates exposed before this scanning exposure. That is, the correction value string to be applied to the nth substrate can be determined based on an error between the heights of the substrate surface acquired when scanning exposure is performed on the first to (n-1)th substrates. Also, a correction value string to be used when exposing the first substrate can be determined, before scanning exposure of the substrate, by performing only driving of the substrate stage 16 without exposing the substrate.

Like FIG. 4A, FIGS. 5A and 5B show the positions of the plurality of measurement positions 30 and the scanning path 21a of the slit-shaped light (irradiation region 21) when performing scanning exposure on the plurality of shot regions 15a formed on the substrate 15. FIG. 5A is a view showing a state in which the measurement positions $30b_1$ to $30b_3$ in the measuring device 17 have reached the first measurement points $40a_1$ to $40a_3$ in the shot region 15a. In this state, the controller 20 causes the measuring device 17 to measure the heights of the first measurement points $40a_1$ to $40a_3$ in the shot region 15a at the measurement positions $30b_1$ to $30b_3$, prior to the measurement positions $30a_1$ to $30a_3$ formed inside the irradiation region 21. Then, based on the heights of the measurement points $40a_1$ to $40a_3$ measured at the measurement positions $30b_1$ to $30b_3$ in the measuring device 17, the controller 20 determines a command value (first command value) for driving the substrate stage 16 so that the measurement points $40a_1$ to $40a_3$ are arranged at the target height. Also, FIG. 5B is a view showing a state in which the measurement positions $30b_1$ to $30b_3$ in the measuring device 17 have reached the second measurement points $40b_1$ to $40b_3$ in the shot region 15a. In this state, the controller 20 causes the measuring device 17 to measure the heights of the second measurement points $40b_1$ to $40b_3$ in the shot region 15a at the measurement positions $30b_1$ to $30b_3$, prior to the measurement positions $30a_1$ to $30a_3$ formed inside the irradiation region 21. Then, based on the heights of the measurement points $40b_1$ to $40b_3$ measured at the measurement positions $30b_1$ to $30b_3$ in the measuring device 17, the controller 20 determines a command value (second command value) for driving the substrate stage 16 so that the measurement points $40b_1$ to $40b_3$ are arranged at the target height.

The controller 20 drives the substrate stage 16 in the Z direction in accordance with the first command value before the irradiation region 21 reaches the measurement points $40a_1$ to $40a_3$. When the irradiation region 21 has reached the measurement points $40a_1$ to $40a_3$, the controller 20 causes the measuring device 17 to measure the heights of the measurement points $40a_1$ to $40a_3$ at the measurement positions $30a_1$ to $30a_3$ formed inside the irradiation region 21. Then, the controller 20 generates a correction value (first correction value) so as to reduce, by driving of the substrate stage 16, a focus error between the target height and the heights of the measurement points $40a_1$ to $40a_3$ measured at the measurement positions $30a_1$ to $30a_3$ by the measuring device 17. The focus error will be referred to as a leveling error hereinafter. Likewise, the controller 20 drives the substrate stage 16 in the Z direction in accordance with the second command value before the irradiation region 21 reaches the measurement points $40b_1$ to $40b_3$. When the irradiation region 21 has reached the measurement points $40b_1$ to $40b_3$, the controller 20 causes the measuring device 17 to measure the heights of the measurement points $40b_1$ to $40b_3$ at the measurement positions $30a_1$ to $30a_3$ formed inside the irradiation region 21. Then, the controller 20 calculates a correction value (second correction value) so as to reduce a leveling error between the target height and the heights of the measurement points $40b_1$ to $40b_3$ measured at the measurement positions $30a_1$ to $30a_3$ by the measuring device 17. A correction value string can be generated by thus calculating a correction value at each of the plurality of measurement points 40 in (the shot region 15a of) the substrate 15.

As described above, the step of generating a correction value string may also be performed while scanning exposure is performed on the substrate 15. The determined correction value can be applied from a substrate as a target of the next scanning exposure. For example, when performing scanning exposure on the nth substrate, as described previously, the controller 20 causes the measuring device 17 to sequentially measure the heights of the plurality of measurement points 40 of the substrate at the measurement positions $30b_1$ to $30b_3$, and determines a command value at each measurement point 40 whenever measurement is performed. After that, the controller 20 corrects the determined command values one by one by using each corresponding portion of a correction value string determined by using the first to (n-1)th substrates, and controls driving of the substrate stage 16 in accordance with the corrected command values. Thus, the step of determining a command value at each measurement point 40 and the step of correcting the determined command value by using a correction value are repeated while scanning the slit-shaped light. This makes it possible to arrange the height of the substrate surface in the irradiation region 21 at the target height (focusing plane), and accurately overlay the mask pattern on the shot region on the substrate. Also, while performing scanning exposure on the nth substrate, the controller 20 causes the measuring device 17 to measure the heights of the measurement points 40 at the measurement positions $30a_1$ to $30a_3$ formed inside the irradiation region 21, thereby obtaining a leveling error string. Subsequently, the controller 20 updates the correction value string by using the leveling error string obtained for the nth substrate. The updated correction value string is applicable to scanning exposure of the (n+1)th substrate. The leveling error string herein mentioned is data obtained by enumerating leveling errors at the plurality of measurement points 40 in (the shot region 15a of) the substrate 15.

Figure 6:
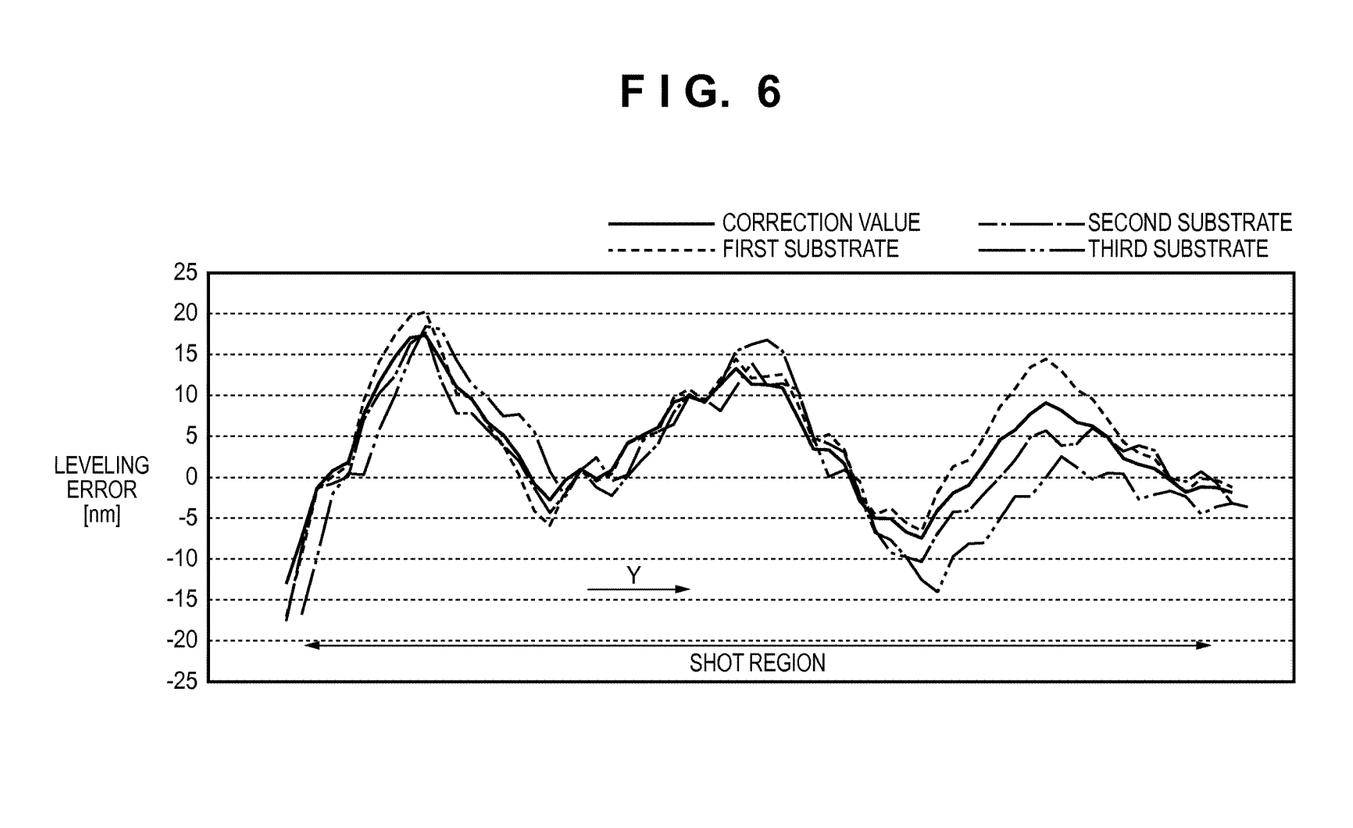
FIG. 6 is a view showing a leveling error string obtained for each of a plurality of substrates.

FIG. 6 is a view showing the leveling error string on the shot region 15a obtained for each of the plurality of substrates 15. Referring to FIG. 6, the abscissa indicates a position on the shot region 15a in the slit-shaped light scanning direction, and the ordinate indicates the leveling error. Also, FIG. 6 shows the leveling error strings of three substrates 15. A method of obtaining a correction value string in the shot region 15a from the leveling error strings of the three substrates 15 will be explained below with reference to FIG. 6. First, the controller 20 obtains the correlation coefficient of the leveling error string of the second substrate based on the leveling error string of the first substrate, and the correlation coefficient of the leveling error string of the third substrate based on the leveling error string of the first substrate. Then, the controller 20 determines whether the obtained correlation coefficients fall within a preset allowable range. If the correlation coefficients fall within the allowable range, the controller 20 generates a correction value string so as to correct the average value of the leveling errors between the three substrates. The controller 20 stores the correlation value string thus determined as a table or high-order function for, for example, each substrate 15 or each shot region 15a.

On the other hand, if one of the obtained correlation coefficients does not fall within the allowable range, the controller 20 removes the leveling error string of a substrate having a low correlation, and generates a correction value string so as to correct the average value of the leveling errors between the remaining substrates. Assume that the leveling error string correlation coefficient between the first and second substrates and the leveling error string correlation coefficient between the first and third substrates do not fall within the allowable range. In this case, the controller 20 removes the leveling error string of the first substrate, and obtains the leveling error string correlation coefficient between the second and third substrates. Subsequently, the controller 20 determines whether the obtained correlation coefficient falls within the allowable range. If the obtained correlation coefficient falls within the allowable range, the controller 20 generates a correction value string so as to correct the average value of leveling errors between the second and third substrates. If the obtained correlation coefficient does not fall within the allowable range, the controller 20 regards that the leveling error strings have no correlation, and does not determine any correction value string. Thus, based on leveling error correlations between a plurality of substrates, the controller 20 determines a substrate for which the leveling error average value is to be obtained, from the plurality of substrates. Then, the controller 20 obtains the leveling error average value by using the determined substrate, and generates a correction value string so as to correct the average value.

In the first embodiment, the measurement value obtained by the measuring device 17 is directly used as the leveling error for generating a correction value string. However, the present invention is not limited to this. For example, it is also possible to perform moving average (processing) of the substrate stage 16 along the slit-shaped light scanning direction or a filtering process using a low-pass filter on the measurement value obtained by the measuring apparatus 17, and determine a correction value string by using the processed data. The processing like this can limit the correction value string to a frequency band controllable by the substrate stage 16, and improve the tracking performance (tracking characteristic) of the substrate stage 16 with respect to the correction value string. The correction value string may also be stored for each of the layout of the shot regions 15a, the scanning velocity of the slit-shaped light, and another exposure condition. The correction value string thus stored can be used in an exposure process having the same condition after that.

As described above, the exposure apparatus 100 of the first embodiment corrects the command value string for driving the substrate stage 16 by the correction value string, and controls Z-direction driving of the substrate stage 16 in accordance with the corrected command value string. Also, the controller 20 determines the correction value string so as to correct the error between the height of the substrate surface and the target height when the substrate stage 16 is driven in the Z direction in accordance with the command value string. When performing scanning exposure, therefore, the exposure apparatus 100 can accurately arrange the substrate surface at the target height (focusing plane), and accurately overlay the pattern of the mask 12 on the shot region 15a on the substrate.

In the first embodiment, the example in which the correction value string is generated based on the leveling error string of a plurality of substrates has been explained. However, the correction value string may also be determined based on the leveling error string of one substrate. In this case, it is also possible to repeat a step of acquiring the leveling error string of one substrate a plurality of times, and determine the average value as a correction value string. In addition, the example in which a correction value string is generated for the shot region 15a has been explained in the first embodiment, but a correction value string may also be determined for a part of the shot region 15a instead of the whole shot region 15a. For example, the focusing accuracy at the end portion of the shot region 15a can be improved by generating a correction value string for only the first measurement points $40a_1$ to $40a_3$ in the shot region 15a. Furthermore, the exposure apparatus 100 may obtain a leveling error string whenever performing scanning exposure on a new substrate, and updates the correction value string by using the leveling error string. By thus updating the correction value string whenever performing scanning exposure on a substrate, it is possible to correct deterioration with time (for example, deterioration of the flatness with time) of the stage base, a mirror (bar mirror) forming the (laser) interferometer, and the like.

Second Embodiment

Figure 7:
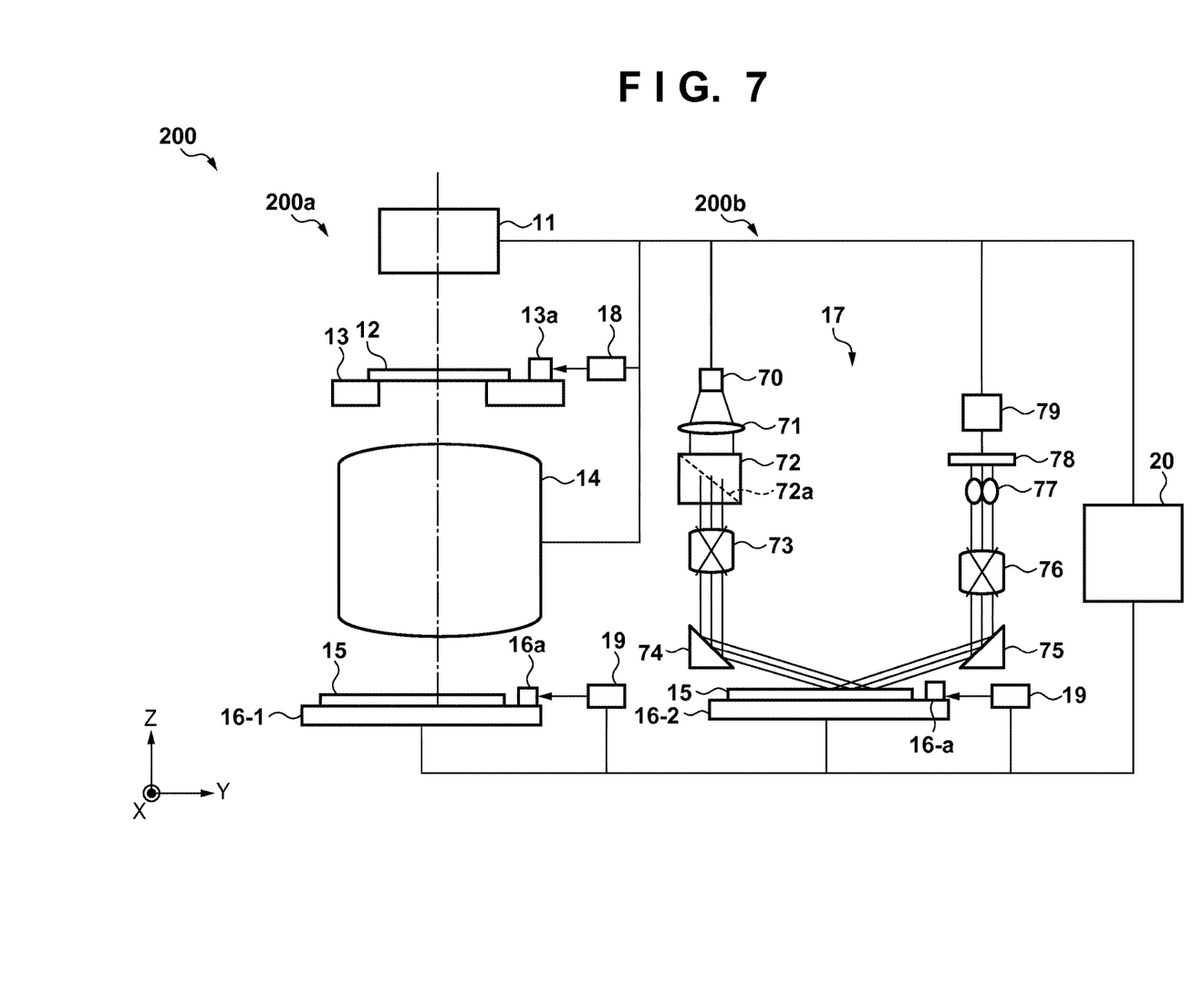
FIG. 7 is a schematic view showing the arrangement of an exposure apparatus according to the second embodiment.

An exposure apparatus 200 of the second embodiment of the present invention will be explained with reference to FIG. 7. FIG. 7 is a schematic view showing the arrangement of the exposure apparatus 200 of the second embodiment. The exposure apparatus 200 of the second embodiment is a so-called twin stage type exposure apparatus, and can include an exposure station 200a (a patterning station), a measuring station 200b, and a plurality of substrate stages 16-1 and 16-2. The exposure station 200a includes an illumination optical system 11, mask stage 13, and projection optical system 14, and forms a pattern on a substrate 15 by performing scanning exposure on the substrate 15. The measuring station 200b includes a measuring device 17, and measures the height of the substrate surface. The plurality of substrate stages 16-1 and 16-2 can be swapped between the exposure station 200a and measuring station 200b. The arrangements of the individual units of the exposure apparatus 200 of the second embodiment are the same as those of the first embodiment, so a repetitive explanation thereof will be omitted.

Figure 8:
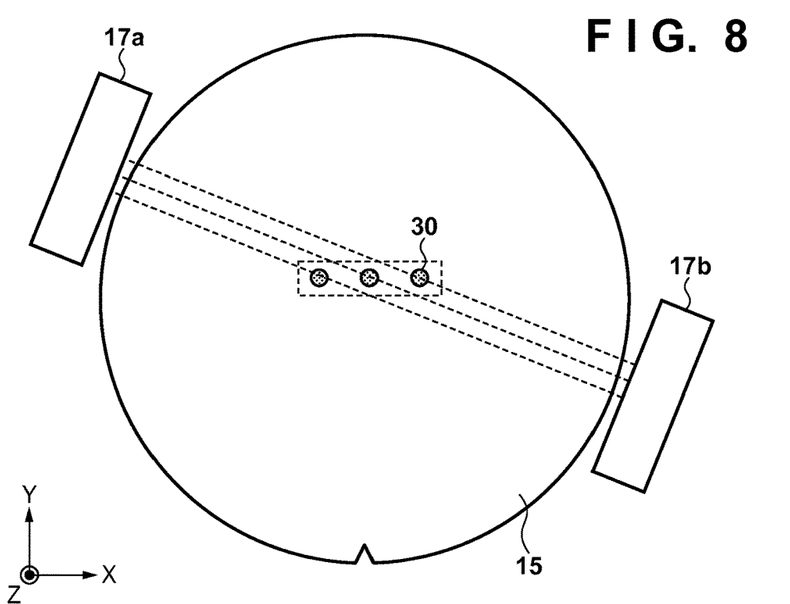
FIG. 8 is a view showing the layout of a plurality of measurement positions in a measuring device.

The layout of a plurality of measurement positions 30 in the measuring device 17 of the measuring station 200b will be explained below. FIG. 8 is a view showing the layout of the plurality of measurement positions 30 in the measuring device 17 of the measuring station 200b. In the second embodiment, the plurality of measurement positions 30 are laid out along the non-scanning direction so as to be able to measure a plurality of measurement points 40 on one shot region 15a by driving the substrate stage 16 in the scanning direction (Y direction) of slit-shaped light. However, the present invention is not limited to this. For example, the plurality of measurement positions 30 may also be laid out so as to be able to measure a plurality of measurement points in two or more shot regions arranged adjacent to each other in the non-scanning direction by driving the substrate stage 16 in the scanning direction.

In the exposure apparatus 200 configured as described above, when scanning exposure is performed on a substrate mounted on, for example, the substrate stage 16-1, a substrate as a next target of scanning exposure is mounted on the substrate stage 16-2. The measuring device 17 of the measuring station 200b measures the height of the substrate surface of this substrate mounted on the substrate stage 16-2. A controller 20 stores data of the substrate surface height measured by the measuring device 17 of the measuring station 200b. After scanning exposure of the substrate mounted on the substrate stage 16-1 is complete, the positions of the substrate stages 16-1 and 16-2 are swapped, scanning exposure on the substrate mounted on the substrate stage 16-2 is started. In this step, the controller 20 performs scanning exposure on the substrate while controlling Z-direction driving of the substrate stage 16-2 based on the stored substrate surface height data, such that the measurement points 40 on the substrate surface are arranged at the target height. In this scanning exposure, however, if the response of driving of the substrate stage to scanning of the substrate is insufficient, it may become difficult to arrange the substrate surface on the focusing plane. In the exposure apparatus 200 of the second embodiment, therefore, as in the exposure apparatus 100 of the first embodiment, a correction value string is so determined as to correct (reduce) a leveling error between the substrate surface height and target height when driving the substrate stage 16 in the Z direction in accordance with a command value string. A method of generating a correction value string for driving the substrate stage 16 so as to correct the leveling error of the substrate surface height in the exposure apparatus 200 of the second embodiment will be explained below.

Figure 9:
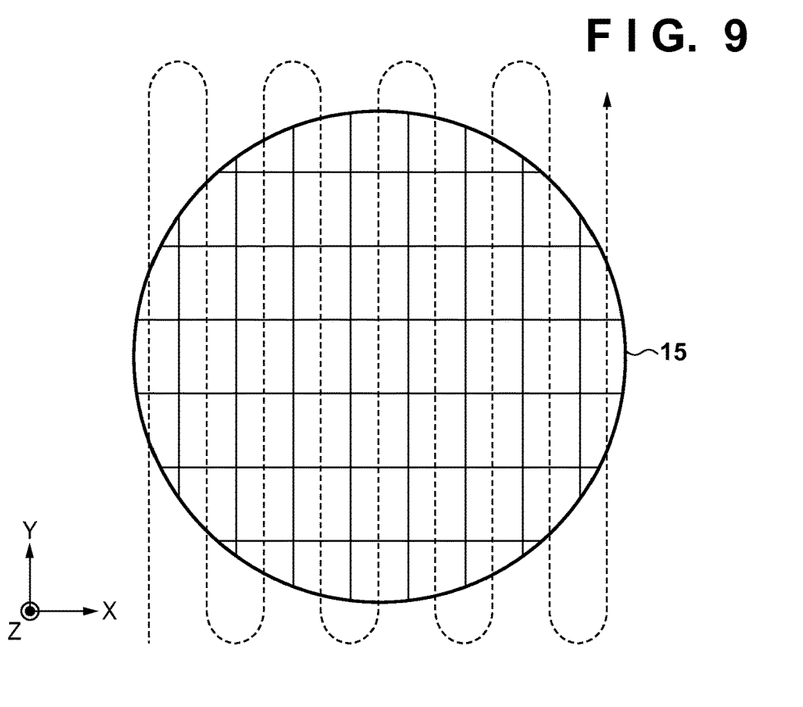
FIG. 9 is a view showing the moving path of measurement positions in the measuring device.

First, in the measuring station 200b, the controller 20 moves the measurement positions 30 of the measuring device 17 on a substrate as indicated by the broken-line arrow in FIG. 9, and causes the measuring device 17 to measure the heights of the plurality of measurement points 40 formed in each shot region 15a on the substrate. Then, based on the heights (measurement values) of the measurement points 40 measured by the measuring device 17, the controller 20 determines a command value string for driving the substrate stage 16 so as to arrange the measurement points 40 at the target height. Subsequently, the controller 20 drives the substrate stage 16 in accordance with the determined command value string, and causes the measuring device 17 to measure the heights at the plurality of measurement points 40 again. After that, the controller 20 generates a correction value string so as to correct the leveling error between the target height and the height of each measurement point 40 measured by the measuring device 17. Then, while performing scanning exposure on the substrate in the exposure station 200a, the controller 20 controls Z-direction driving of the substrate stage 16 in accordance with the command value string corrected by the determined correction value string.

As described above, the exposure apparatus 200 of the second embodiment can accurately arrange the substrate surface at the target height (focusing plane) during scanning exposure, as in the exposure apparatus 100 of the first embodiment. That is, a pattern of a mask 12 can accurately be overlaid on the shot region 15a on the substrate. In the exposure apparatus 200 of the second embodiment, it is also possible to determine a correction value string to be used in common to a plurality of substrates from the leveling error strings of the plurality of substrates, or determine a correction value string for each substrate. The exposure apparatus 200 of the second embodiment is divided into the exposure station 200a for performing scanning exposure, and the measuring station 200b for performing measurement. Therefore, while the exposure station 200a is performing scanning exposure on a given substrate, the measuring station 200b can measure the height of the substrate surface of another substrate. That is, even when generating a correction value string for each substrate, the exposure apparatus 200 of the second embodiment can suppress a decrease in throughput.

<Embodiment of Method of Manufacturing Article>

A method of manufacturing an article according to an embodiment of the present invention is suitable for manufacturing a microdevice such as a semiconductor device, and an article such as an element having a microstructure. The method of manufacturing an article according to the embodiment includes a step of forming a latent image pattern on a photosensitive agent applied to a substrate by using the aforementioned lithography apparatus (exposure apparatus) (step of exposing a substrate), and a step of developing the substrate on which the latent image pattern is formed in the preceding step. Further, the manufacturing method can include other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-001238, filed Jan. 7, 2014, which is hereby incorporated by reference herein in its entirety.

What is claimed is:

1. A scanning exposure apparatus for exposing a substrate to a beam while scanning the substrate with respect to the beam for scanning exposure, the apparatus comprising:

a stage configured to hold the substrate while the substrate is being scanned with respect to the beam;

a measuring device configured to obtain a measurement value of a height of each of a plurality of measurement points, including a first measurement point and a second measurement point, of each of a plurality of substrates, including a first substrate and a second substrate, currently held by the stage and being scanned with respect to the beam, the plurality of measurement points being arranged along a scanning direction along which the substrate is being scanned with respect to the beam; and a controller configured to:
  drive the first substrate currently held by the stage in a height direction so that the first measurement point of the first substrate is arranged at a target height, based on the measurement value of the height obtained at the first measurement point of the first substrate;
  determine, as a correction value, a difference between the measurement value of the height obtained at the second measurement point of the first substrate and the target height; and then
  control focus driving of the stage currently holding the second substrate being scanned with respect to the beam, based on:
    a current measurement value of the height of the first measurement point of the second substrate; and
    the correction value, which has been determined before obtaining the current measurement value, corresponding to the first measurement point of the second substrate.

2. The apparatus according to claim 1, wherein the controller is configured to determine the correction value based on an average value of a plurality of focus errors obtained with respect to the plurality of substrates in a case where the focus driving of the stage has been performed based on the measurement value with respect to each of the plurality of substrates.

3. The apparatus according to claim 1, wherein the controller is configured to apply the determined correction value for a substrate or a shot region different from a substrate or a shot region used to obtain the correction value.

4. The apparatus according to claim 1, wherein the measuring device is configured to obtain:
  a first measurement value with respect to one measurement point before forming a pattern on the one measurement point, and
  a second measurement value with respect to the one measurement point in parallel with forming the pattern on the one measurement point.

5. The apparatus according to claim 1, wherein the controller is configured to store, as a table or a function or both, a plurality of correction values obtained with respect to the plurality of measurement points on at least the first substrate.

6. The apparatus according to claim 1, wherein:
a pattern is formed on the substrate being scanned with respect to the beam,
the first substrate currently held by the stage is scanned so that the measurement device obtains the measurement value of the height of the second measurement point of the first substrate after obtaining the measurement value of the height of the first measurement point of the first substrate.

7. A method of manufacturing an article, the method comprising steps of:

forming a pattern on a substrate using a scanning exposure apparatus; and processing the substrate, on which the pattern has been formed, to manufacture the article, wherein the scanning exposure apparatus exposes the substrate to a beam while scanning the substrate with respect to the beam for scanning exposure, and includes:

a stage configured to hold the substrate while the substrate is being scanned with respect to the beam;
  a measuring device configured to obtain a measurement value of a height of each of a plurality of measurement points including a first measurement point and a second measurement point, of each of a plurality of substrates, including a first substrate and a second substrate, currently held by the stage and being scanned with respect to the beam, the plurality of measurement points being arranged along a scanning direction along which the substrate is being scanned with respect to the beam; and
  a controller configured to:
    drive the first substrate currently held by the stage in a height direction so that the first measurement point of the first substrate is arranged at a target height, based on the measurement value of the height obtained at the first measurement point of the first substrate;
    determine, as a correction value, a difference between the measurement value of the height obtained at the second measurement point of the first substrate and the target height; and then
    control focus driving of the stage currently holding the second substrate being scanned with respect to the beam, based on:
      a current measurement value of the height of the first measurement point of the second substrate; and
      the correction value, which has been determined before obtaining the current measurement value, corresponding to the first measurement point of the second substrate.

8. The method according to claim 7, wherein:
the pattern is formed on the substrate being scanned with respect to the beam,
the second substrate currently held by the stage is scanned so that the measurement device obtains the measurement value of the height of the second measurement point of the first substrate after obtaining the measurement value of the height of the first measurement point of the first substrate.

9. A scanning exposure method of exposing a substrate to a beam while scanning the substrate with respect to the beam for scanning exposure, the method comprising the steps of:
  holding the substrate with a stage while the substrate is being scanned with respect to the beam;
  obtaining a measurement value of a height of each of a plurality of measurement points, including a first measurement point and a second measurement point, of each of a plurality of substrates, including a first substrate and a second substrate, currently held by the stage and being scanned with respect to the beam, the plurality of measurement points being arranged along a scanning direction along which the substrate is being scanned with respect to the beam;
  driving the first substrate currently held by the stage in a height direction so that the first measurement point of the first substrate is arranged at a target height, based on the measurement value of the height obtained at the first measurement point of the first substrate;

determining, as a correction value, a difference between the measurement value of the height obtained at the second measurement point of the first substrate and the target height; and then controlling focus driving of the stage currently holding the second substrate being scanned with respect to the beam, based on:
- a current measurement value of the height of the first measurement point of the second substrate; and
- the correction value, which has been determined before obtaining the current measurement value, corresponding to the first measurement point of the second substrate.

10. The method according to claim 9, wherein:

a pattern is formed on the substrate being scanned with respect to the beam, the first substrate currently held by the stage is scanned so that the obtaining step obtains the measurement value of the height of the second measurement point of the first substrate after obtaining the measurement value of the height of the first measurement point of the first substrate.

* * * * *